(12) United States Patent
Oe

(10) Patent No.: US 11,700,702 B2
(45) Date of Patent: Jul. 11, 2023

(54) WIRELESS TERMINAL DEVICE

(71) Applicant: Sumitomo Electric Industries, Ltd., Osaka (JP)

(72) Inventor: Masanobu Oe, Osaka (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 163 days.

(21) Appl. No.: 17/293,484

(22) PCT Filed: Jan. 10, 2019

(86) PCT No.: PCT/JP2019/000498
§ 371 (c)(1),
(2) Date: May 13, 2021

(87) PCT Pub. No.: WO2020/144804
PCT Pub. Date: Jul. 16, 2020

(65) Prior Publication Data
US 2022/0022333 A1    Jan. 20, 2022

(51) Int. Cl.
*H05K 5/03* (2006.01)
*H05K 5/00* (2006.01)
*H05K 7/14* (2006.01)

(52) U.S. Cl.
CPC ............ *H05K 5/03* (2013.01); *H05K 5/0086* (2013.01); *H05K 7/1427* (2013.01)

(58) Field of Classification Search
USPC ................................ 361/728, 752, 796, 800
See application file for complete search history.

(56) References Cited

U.S. PATENT DOCUMENTS

| | | | |
|---|---|---|---|
| 8,593,828 B2 * | 11/2013 | Blackwell, Jr. ...... | G02B 6/4278 361/720 |
| 2020/0150163 A1 * | 5/2020 | Beishline ............... | G01R 15/00 |

FOREIGN PATENT DOCUMENTS

| JP | 2000-306185 A | 11/2000 |
|---|---|---|
| JP | 2005-339078 A | 12/2005 |
| JP | 2008-304124 A | 12/2008 |
| JP | 2016-052137 A | 4/2016 |

OTHER PUBLICATIONS

International Search Report and Written Opinion dated Mar. 5, 2019, received for PCT Application PCT/JP2019/000498, Filed on Jan. 10, 2019, 6 pages including English Translation.

* cited by examiner

*Primary Examiner* — Hung S. Bui
(74) *Attorney, Agent, or Firm* — Xsensus LLP

(57) ABSTRACT

This wireless terminal device includes: an input portion; an output portion; a circuit board module electrically connected to the input portion and the output portion; an external power supply module which is detachably connected to the circuit board module, includes an input terminal for receiving input from an external power supply, converts an input voltage inputted to the input terminal, and outputs an output voltage; and a case for storing the input portion, the output portion, the circuit board module, and the external power supply module. In a storage space, a battery can be stored when the external power supply module is detached from the circuit board module. The circuit board module includes a connector connection portion to which a connector of the external power supply module or a connector of the battery can be selectively connected, and which is provided at a position spatially connected to the storage space.

8 Claims, 16 Drawing Sheets

WIRELESS TERMINAL DEVICE

CROSS-REFERENCE TO RELATED APPLICATION

The present application is based on PCT filing PCT/JP2019/000498, filed Jan. 10, 2019, the entire contents of which are incorporated herein by reference.

TECHNICAL FIELD

The present invention relates to a wireless terminal device.

BACKGROUND ART

Patent Literature 1 discloses a wireless terminal device including a vibration sensor, such as an acceleration sensor, capable of detecting vibration, and a transmission device configured to wirelessly transmit a detected vibration signal to an external device, and discloses that the wireless terminal device is attached to equipment in operation, to perform determination as to abnormality in the equipment.

CITATION LIST

Patent Literature

PATENT LITERATURE 1: Japanese Laid-Open Patent Publication No. 2016-052137

SUMMARY OF INVENTION

A wireless terminal device of the present disclosure includes: an input portion configured to receive an input from a sensor; an output portion configured to convert a signal inputted to the input portion from the sensor, to a radio signal, and output the radio signal; a circuit board module electrically connected to the input portion and the output portion; an external power supply module detachably connected to the circuit board module, and including an input terminal for receiving an input from an external power supply, the external power supply module being configured to convert an input voltage inputted to the input terminal and output an output voltage; and a case in which a storage space for storing the external power supply module is formed, the case being configured to store the input portion, the output portion, the circuit board module, and the external power supply module. The storage space allows a battery to be stored therein when the external power supply module is detached from the circuit board module. The circuit board module includes a connector connection portion that allows one of a connector of the external power supply module and a connector of the battery to be selectively connected thereto, the connector connection portion being provided at a position spatially connected to the storage space.

DESCRIPTION OF EMBODIMENTS

Figure 1:
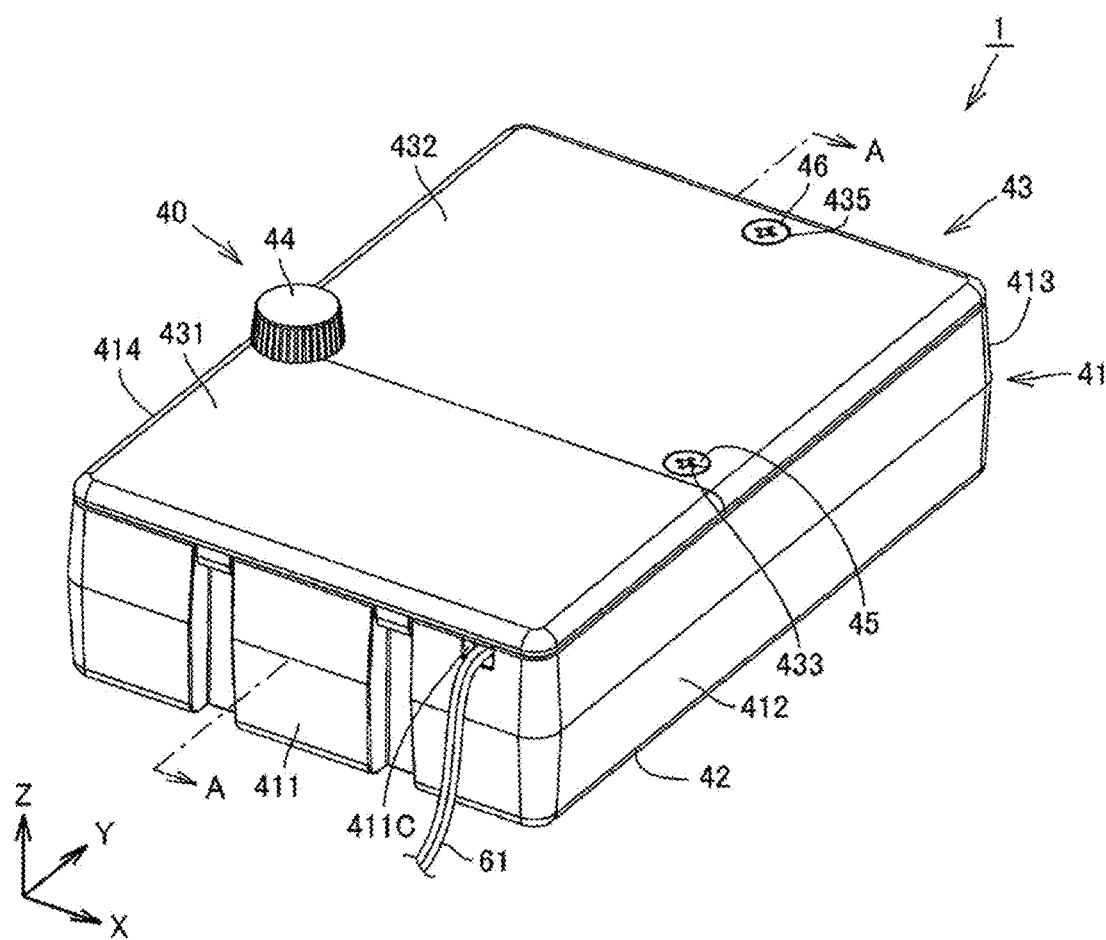
FIG. 1 is a schematic perspective view showing a structure of a wireless terminal device in embodiment 1.

Problems to be Solved by the Present Disclosure

A wireless terminal device may be tentatively installed in a factory or the like. In addition, the installation location of the wireless terminal device may be changed to consider an appropriate installation location. In such a case, in view of ease of installation and detachment, it is preferable that the wireless terminal device is driven by a battery. However, if the wireless terminal device is to be permanently installed or after the installation position thereof is determined, it is preferable that the wireless terminal device is driven using an external power supply continuously installed in the factory. Accordingly, an object is to provide a wireless terminal device that can be driven using an external power supply and also can be driven by a battery.

Effects of the Present Disclosure

According to the present disclosure, it is possible to provide a wireless terminal device that can be driven using an external power supply and also can be driven by a battery.

Description of Embodiments of the Present Disclosure

First, embodiments of the present disclosure are listed and described. A wireless terminal device of the present disclosure includes: an input portion configured to receive an input from a sensor; an output portion configured to convert a signal inputted to the input portion from the sensor, to a radio signal, and output the radio signal; a circuit board module electrically connected to the input portion and the output portion; an external power supply module detachably connected to the circuit board module, and including an input terminal for receiving an input from an external power supply, the external power supply module being configured to convert an input voltage inputted to the input terminal and output an output voltage; and a case in which a storage space for storing the external power supply module is formed, the case being configured to store the input portion, the output portion, the circuit board module, and the external power supply module. The storage space allows a battery to be stored therein when the external power supply module is detached from the circuit board module. The circuit board module includes a connector connection portion that allows one of a connector of the external power supply module and a connector of the battery to be selectively connected thereto, the connector connection portion being provided at a position spatially connected to the storage space.

The wireless terminal device of the present disclosure includes the external power supply module stored in the storage space. In the storage space, a battery can be stored when the external power supply module is detached. The circuit board module in the wireless terminal device of the present disclosure includes the connector connection portion provided at a position spatially connected to the storage space. With such a structure, the connector of the external power supply module and the connector of the battery can be easily replaced with each other. Therefore, the wireless terminal device can be driven using an external power supply and also the wireless terminal device can be driven with a battery by mounting the battery. Thus, the wireless terminal device of the present disclosure can be driven using an external power supply and also can be driven by a battery.

In the above wireless terminal device, the case may include a holding portion provided in the storage space and having a holding surface having a cylindrical-surface shape so as to allow the battery to be held thereon. With such a structure, the battery can be appropriately held in the storage space and the battery can be restricted from moving.

In the above wireless terminal device, the case may have an opening connecting the storage space and an external space and having a shape that allows the external power supply module and the battery each placed in the storage space to be taken out therethrough. The case may include a lid portion provided so as to allow the opening to be closed and opened. The external power supply module may include a board having a first main surface and a second main surface located on a side opposite to the first main surface in a thickness direction, and a conversion portion provided on the first main surface, and configured to convert the input voltage inputted to the input terminal from the external power supply and output the output voltage. The external power supply module may be stored in the storage space such that the second main surface is opposed to the lid portion. Such a structure can prevent the conversion portion from being damaged by a worker touching the conversion portion.

In the above wireless terminal device, the case may have an opening connecting the storage space and an external space and having a shape that allows the external power supply module and the battery each placed in the storage space to be taken out therethrough. The case may include a lid portion provided so as to allow the opening to be closed and opened, and a holding portion provided in the storage space and having a holding surface having a cylindrical-surface shape so as to allow the battery to be held thereon. The external power supply module may include a board having a first main surface and a second main surface located on a side opposite to the first main surface in a thickness direction, and a conversion portion provided on the first main surface, and configured to convert the input voltage inputted to the input terminal from the external power supply and output the output voltage. The first main surface of the board may be opposed to the holding surface. With such a structure, the conversion portion provided on the board can be stored effectively using a space on the inner side of the holding surface having a cylindrical-surface shape.

In the above wireless terminal device, the case may have a through hole having a shape that allows an external wire connecting the input terminal and the external power supply to pass therethrough. With such a structure, the external wire can be easily led to the outside of the case by passing the external wire through the through hole.

The above wireless terminal device may further include a first member provided inside the case and having a first protrusion protruding in a thickness direction. An external wire connecting the input terminal and the external power supply may be wound in contact with an outer circumferential surface of the first protrusion. With such a structure, movement of the external wire can be restricted by the first protrusion. Thus, the external wire can be easily fixed in the case.

In the above wireless terminal device, the external wire may be wound over more than a half round in a circumferential direction around the first protrusion. Such a structure reduces force of pulling the external wire between the external power supply module and the first protrusion, when the external wire is pulled. Therefore, even when the external wire is pulled, damage around a connection portion of the external wire to the input terminal can be prevented.

The above wireless terminal device may further include a second member provided inside the case and having a second protrusion protruding in a thickness direction. The external wire extending from the external power supply module may be wound in contact with the outer circumferential surface of the first protrusion. The external wire extending from the first protrusion may be wound in contact with an outer circumferential surface of the second protrusion. In a plan view as seen in a direction perpendicular to a plane including a first line along a first direction in which the external wire extends from the external power supply module to the first protrusion and a second line along a second direction in which the external wire extends from the first protrusion to the second protrusion, an angle between the first direction and the second direction may be not greater than 90 degrees. In a plan view as seen in a direction perpendicular to a plane including a third line along a third direction in which the external wire extends from the second protrusion to a side different from the first protrusion side, and the second line, an angle between the second direction and the third direction may be not greater than 90 degrees. Such a structure reduces force of pulling the external wire between the first protrusion and the second protrusion, when the external wire is pulled. Moreover, force of pulling the external wire between the external power supply module and the first protrusion is further reduced. Therefore, even when the external wire is pulled, damage around the connection portion of the external wire to the input terminal can be further prevented.

Details of Embodiments of the Present Disclosure

Next, an embodiment of the wireless terminal device of the present disclosure will be described with reference to the drawings. In the drawings, the same or corresponding parts are denoted by the same reference signs, and descriptions thereof are not repeated.

Embodiment 1

Figure 2:
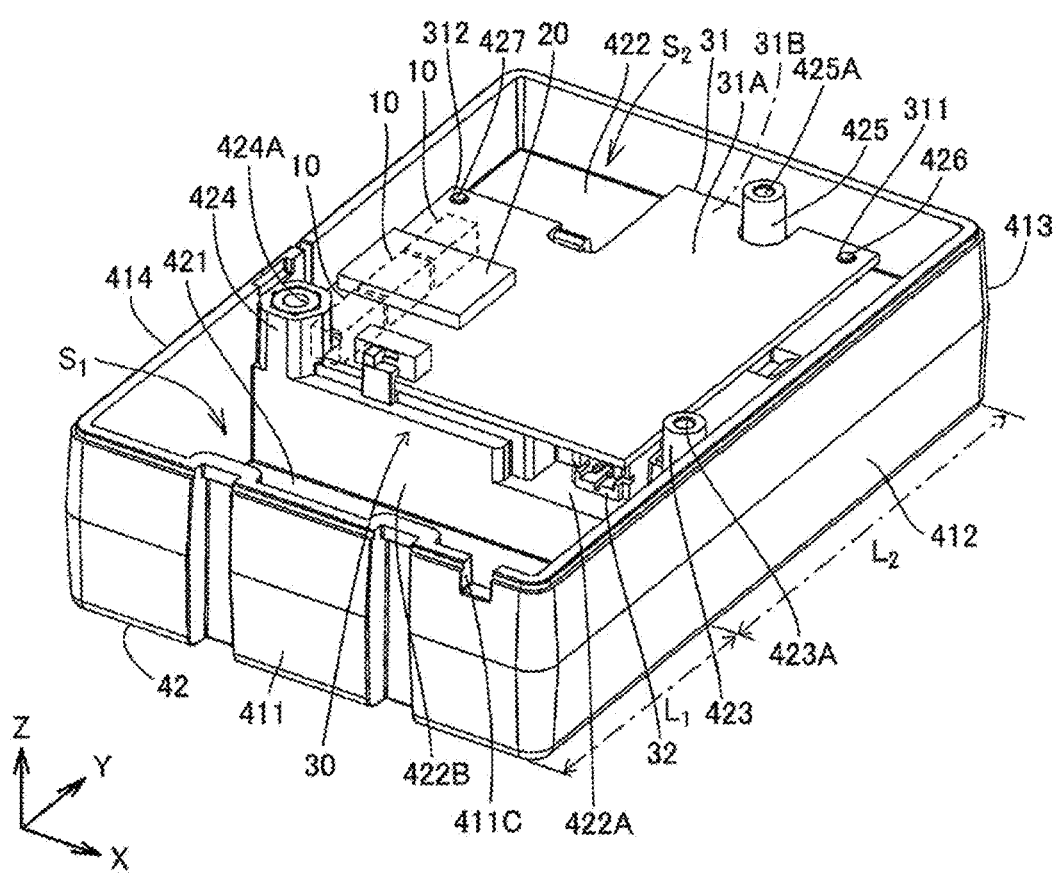
FIG. 2 is a schematic perspective view showing the structure of the wireless terminal device in a state in which a first upper wall portion and a second upper wall portion are detached.
Figure 3:
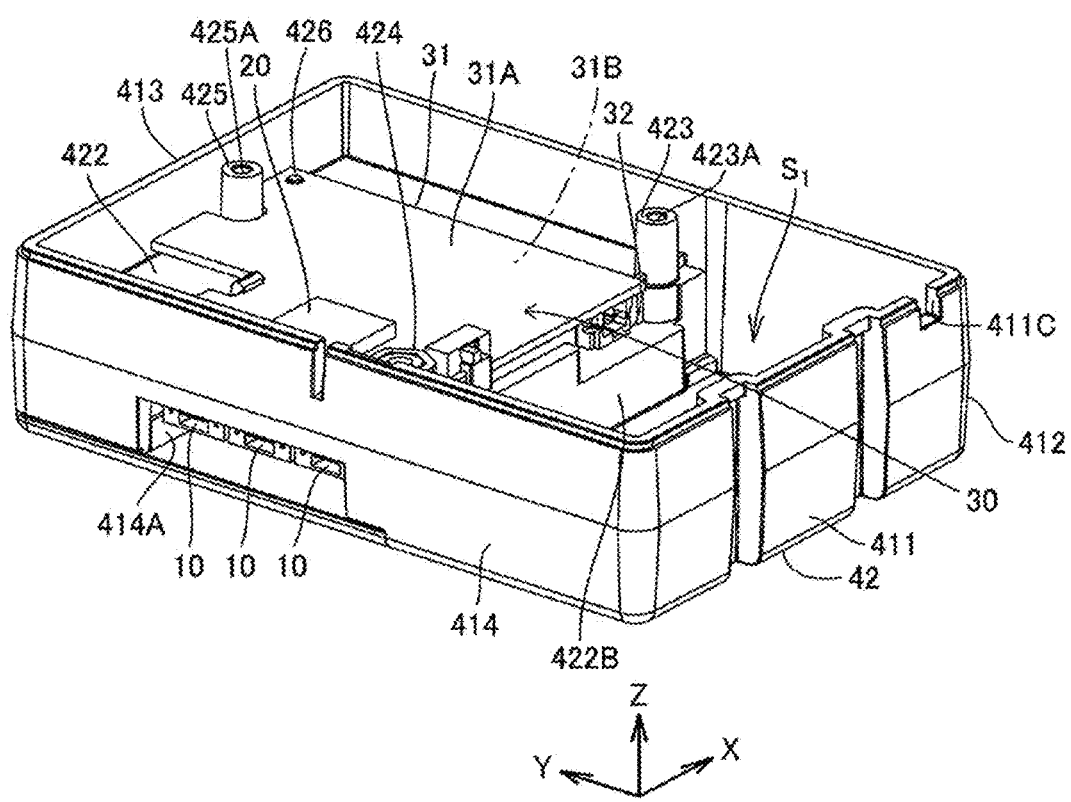
FIG. 3 is a schematic perspective view showing the structure of the wireless terminal device in a state in which the first upper wall portion and the second upper wall portion are detached.
Figure 8:
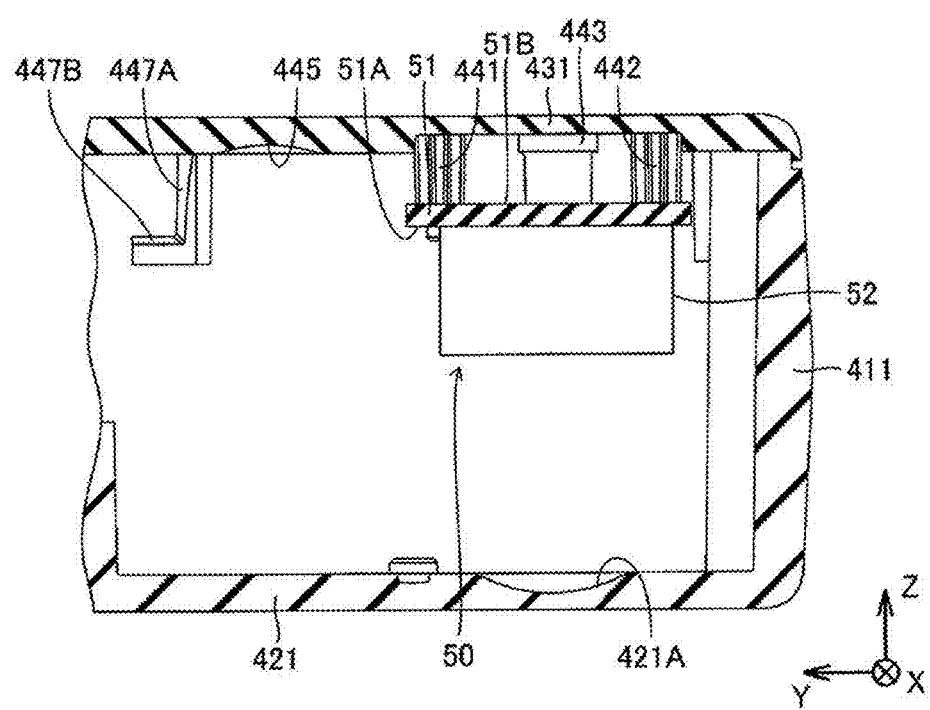
FIG. 8 is a schematic sectional view showing a structure of a case and the first upper wall portion to which the external power supply module is attached.

First, with reference to FIG. 1 to FIG. 10, embodiment 1 will be described. FIG. 2 is a perspective view corresponding to a state in which a first upper wall portion and a second upper wall portion are detached in FIG. 1. FIG. 3 is a schematic perspective view showing a structure of a wireless terminal device as seen from a viewpoint different from FIG. 2. FIG. 8 and FIG. 10 are sectional views taken along line A-A in FIG. 1. In FIG. 1, a Z-axis direction is a direction along the thickness direction of the first upper wall portion. A direction along a long side of a case having a rectangular shape in a plan view as seen in the Z-axis direction is a Y-axis direction, and a direction along a short side thereof is an X-axis direction.

Particularly with reference to FIG. 1 to FIG. 8, a wireless terminal device 1 includes a case 40, input portions 10, an output portion 20, a circuit board module 30, and an external power supply module 50. The case 40 has a rectangular parallelepiped shape having an internal space formed therein. The case 40 includes a hollow tubular side wall portion 41, a bottom wall portion 42, and an upper wall portion 43. The bottom wall portion 42 is provided so as to close one opening of the side wall portion 41. The upper wall portion 43 is provided so as to close another opening of the side wall portion 41.

The side wall portion 41 includes a first side wall portion 411, a second side wall portion 412, a third side wall portion 413, and a fourth side wall portion 414. The first side wall portion 411, the second side wall portion 412, the third side wall portion 413, and the fourth side wall portion 414 have flat-plate shapes. The first side wall portion 411 and the third side wall portion 413 are arranged in parallel so as to be separated from each other in the Y-axis direction. The second side wall portion 412 and the fourth side wall portion 414 are arranged in parallel so as to be separated from each other in the X-axis direction. One end in the X-axis direction of the first side wall portion 411 is connected to the second side wall portion 412. Another end in the X-axis direction of the first side wall portion 411 is connected to the fourth side wall portion 414. One end in the X-axis direction of the third side wall portion 413 is connected to the second side wall portion 412. Another end in the X-axis direction of the third side wall portion 413 is connected to the fourth side wall portion 414. In a plan view as seen in the Z-axis direction, the first side wall portion 411 is provided so as to have right angles with respect to the second side wall portion 412 and the fourth side wall portion 414. In a plan view as seen in the Z-axis direction, the third side wall portion 413 is provided so as to have right angles with respect to the second side wall portion 412 and the fourth side wall portion 414. That is, in a plan view as seen in the Z-axis direction, the side wall portion 41 has a rectangular shape. The first side wall portion 411 and the third side wall portion 413 correspond to the short sides. The second side wall portion 412 and the fourth side wall portion 414 correspond to the long sides. An end surface on the upper wall portion 43 side of the first side wall portion 411 has a cutout 411C in an area on the second side wall portion 412 side with respect to the center in the X-axis direction. The cutout 411C has a shape that allows external wires 61 described later to pass therethrough. The cutout 411C forms a through hole when a first upper wall portion 431 is attached. An end portion on the bottom wall portion 42 side of the fourth side wall portion 414 has, slightly on the third side wall portion 413 side with respect to the center in the Y-axis direction, a through hole 414A penetrating in the thickness direction.

The bottom wall portion 42 has a flat-plate shape. The bottom wall portion 42 has a rectangular shape in a plan view as seen in the Z-axis direction. The bottom wall portion 42 is connected to the side wall portion 41 around the outer periphery thereof. The bottom wall portion 42 includes a first area 421 and a second area 422. A length $L_1$ in the Y-axis direction of the first area 421 is smaller than a length $L_2$ in the Y-axis direction of the second area 422. The bottom wall portion 42 has, in the second area 422, projections 426, 427 protruding in the thickness direction of the bottom wall portion 42. The bottom wall portion 42 has, in the second area 422, columns 423, 424, 425 protruding in the thickness direction of the bottom wall portion 42. The second area 422 has a greater thickness than the first area 421. That is, the height in the Z-axis direction of an inner wall surface in the first area 421 is smaller than the height in the Z-axis direction of an inner wall surface in the second area 422. To describe from another perspective, the distance in the Z-axis direction between the first area 421 and a second upper wall portion 432 is greater than the distance in the Z-axis direction between the second area 422 and the second upper wall portion 432. Therefore, a step portion 422B is formed between the first area 421 and the second area 422.

The first area 421 and the second area 422 each have a rectangular shape in a plan view as seen in the Z-axis direction. The first area 421 and the second area 422 are continuously arranged in the Y-axis direction. Particularly with reference to FIG. 8, the first area 421 has, in an area on the first side wall portion 411 side, a first holding surface 421A having a cylindrical-surface shape and extending in the X-axis direction. The first holding surface 421A has a shape that allows a cylindrical battery to be held thereon.

An end portion on the first area 421 side of the second area 422 has a recess 422A on the second side wall portion 412 side with respect to the center in the X-axis direction. The area where the recess 422A is formed in the second area 422 has a greater thickness than the first area 421. That is, the height in the Z-axis direction of the inner wall surface in the first area 421 is smaller than the height in the Z-axis direction of the inner wall surface in the area where the recess 422A is formed in the second area 422. To describe from another perspective, the distance in the Z-axis direction between the first area 421 and the second upper wall portion 432 is greater than the distance in the Z-axis direction between the area where the recess 422A is formed in the second area 422, and the second upper wall portion 432. In addition, the thickness of the recess 422A is smaller than the thickness of the second area 422 in the area other than the recess 422A. That is, the distance between the recess 422A and the second upper wall portion 432 is greater than the distance between the second area 422 in the area other than the recess 422A, and the second upper wall portion 432.

The first column 423 is provided, on an end part on the first area 421 side of the second area 422, at a position in contact with the second side wall portion 412. The second column 424 is provided, on an end part on the first area 421 side of the second area 422, at a position in contact with the fourth side wall portion 414. The third column 425 is provided, on an end part on the third side wall portion 413 side of the second area 422, at a position on the second side wall portion 412 side with respect to the center in the X-axis direction. The first column 423 has a circular column shape. A screw hole 423A surrounded by a helical wall surface is formed so as to include the center axis of the first column 423. The second column 424 has a prismatic column shape. A screw hole 424A surrounded by a helical wall surface is formed so as to include the center axis of the second column 424. The third column 425 has a circular column shape. A screw hole 425A surrounded by a helical wall surface is formed so as to include the center axis of the third column 425. The first projection 426 is provided between the third column 425 and the second side wall portion 412, in the X-axis direction. The second projection 427 is provided between the second column 424 and the third side wall portion 413, in the Y-axis direction. The first projection 426 and the second projection 427 have circular column shapes.

The upper wall portion 43 includes the first upper wall portion 431 and the second upper wall portion 432 as a lid portion. The second upper wall portion 432 has a flat-plate shape. The second upper wall portion 432 has a rectangular shape in a plan view as seen in the Z-axis direction. The second upper wall portion 432 has a screw hole 433 penetrating in the thickness direction so as to correspond to the screw hole 423A of the first column 423. The second upper wall portion 432 has a screw hole 434 penetrating in the thickness direction so as to correspond to the screw hole 424A of the second column 424. The second upper wall portion 432 has a screw hole 435 penetrating in the thickness direction so as to correspond to the screw hole 425A of the third column 425. On an outer wall surface 432B of the second upper wall portion 432, a recess 436 which is a part having a small thickness is formed in an area where the screw hole 434 is formed.

A screw 45 is screwed in a state in which the second upper wall portion 432 is placed on the side wall portion 41 such that the position where the screw hole 433 is formed and the position where the screw hole 423A is formed coincide with each other. Similarly, a screw 46 is screwed in a state in which the second upper wall portion 432 is placed on the side wall portion 41 such that the position where the screw hole 435 is formed and the position where the screw hole 425A is formed coincide with each other. In this way, the second upper wall portion 432 is fixed to the bottom wall portion 42 (second area 422).

Figure 4:
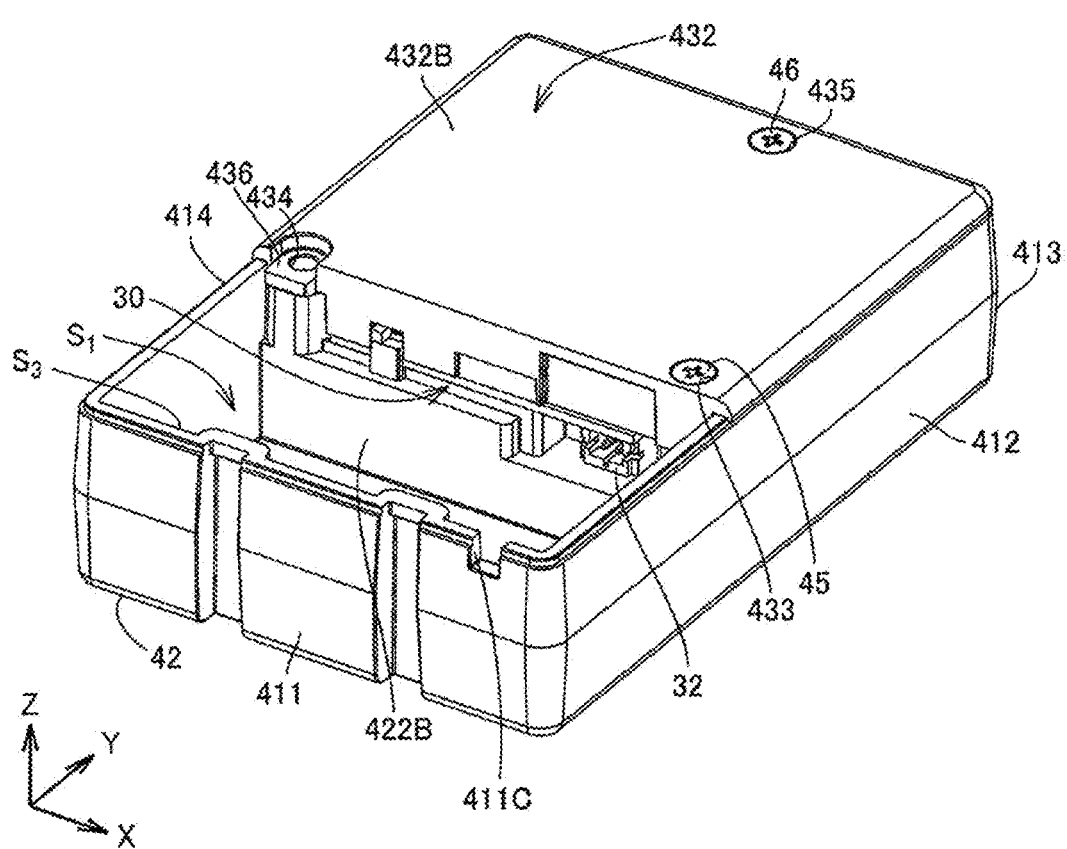
FIG. 4 is a schematic perspective view showing the structure of the wireless terminal device in a state in which the first upper wall portion is detached.
Figure 5:
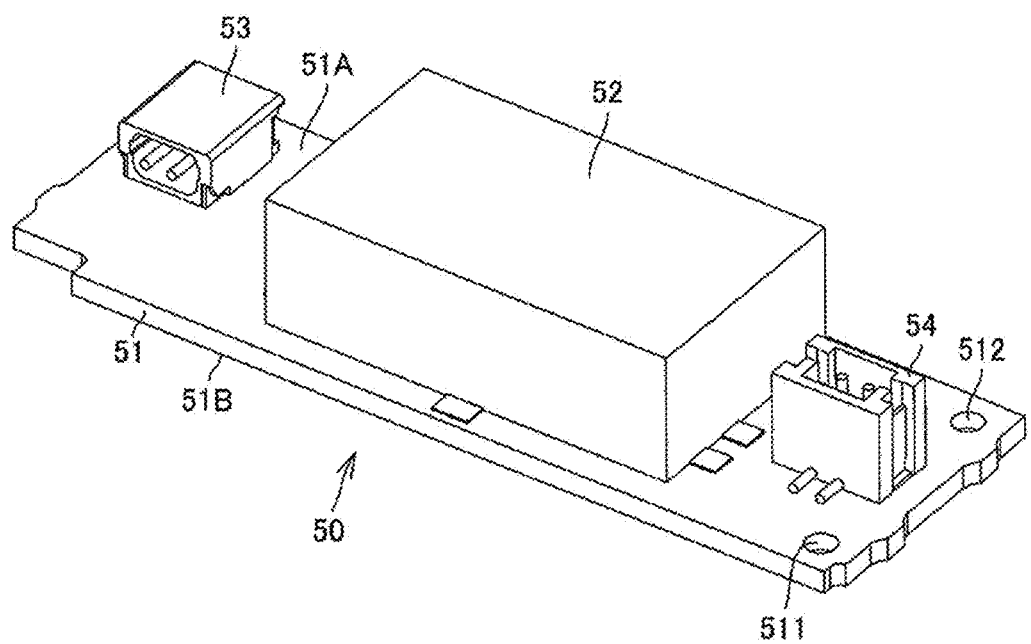
FIG. 5 is a schematic perspective view showing a structure of an external power supply module in embodiment 1.
Figure 6:
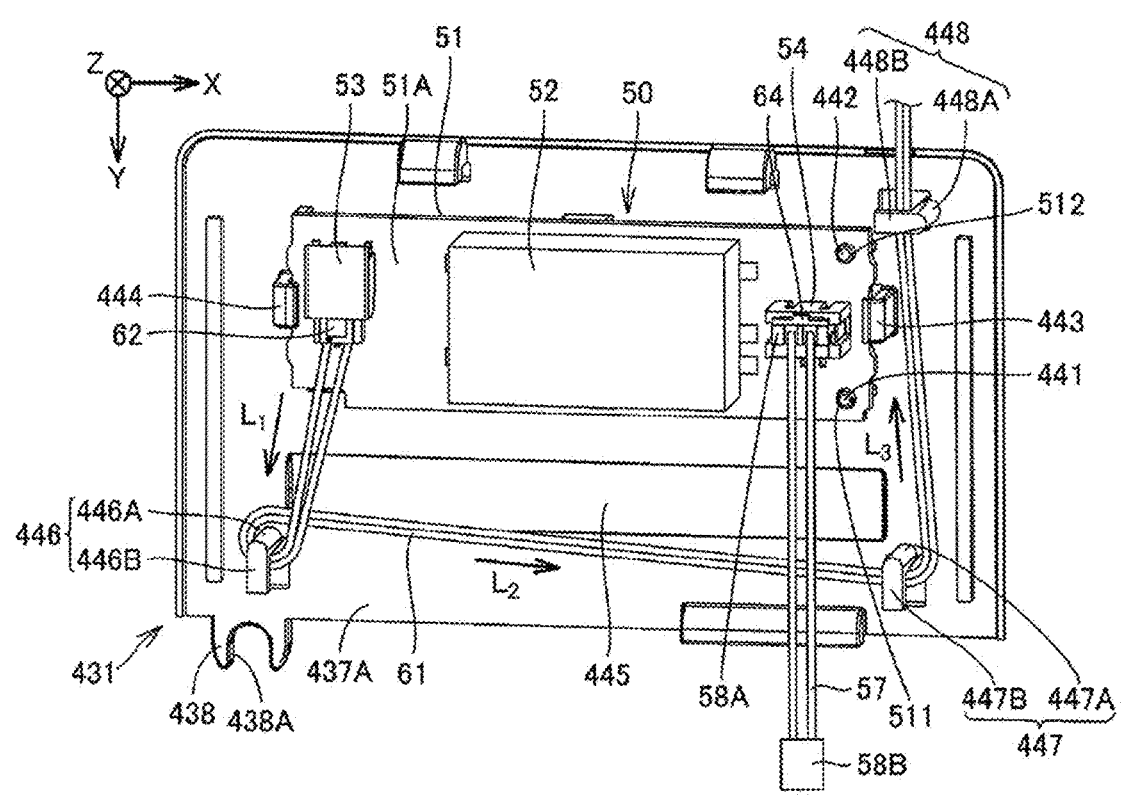
FIG. 6 is a schematic perspective view showing a state in which the external power supply module is mounted to the first upper wall portion.
Figure 7:
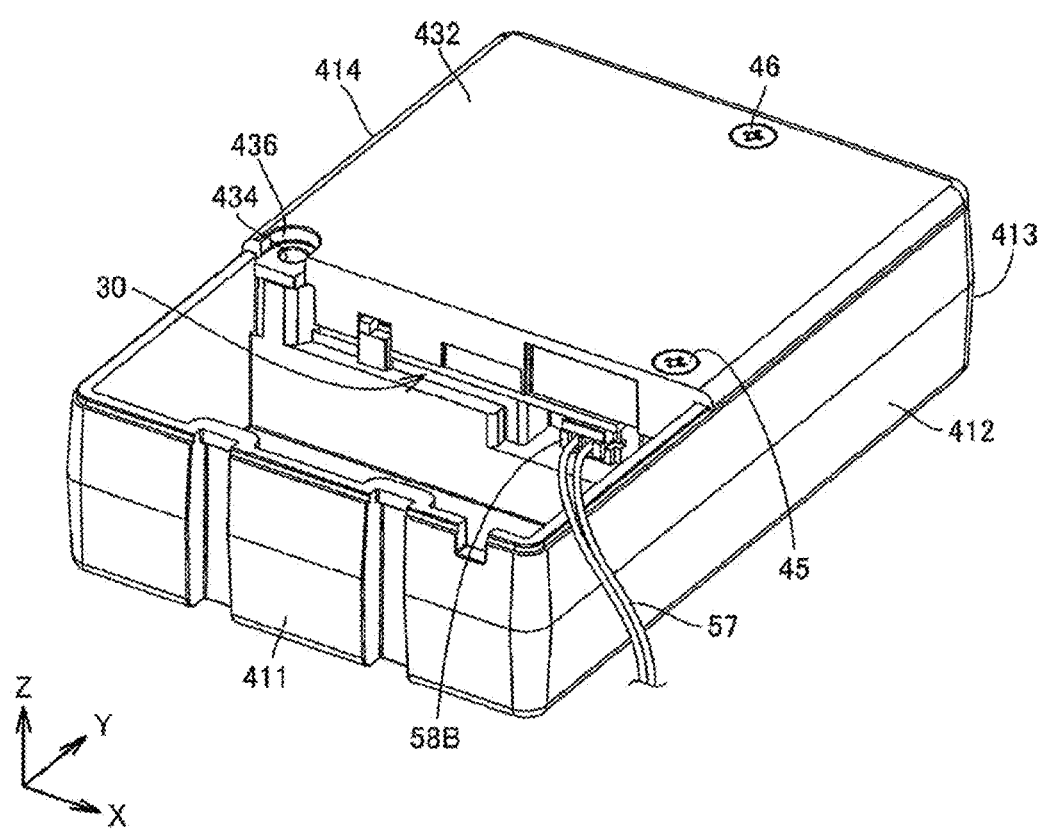
FIG. 7 is a schematic perspective view showing a state in which internal wires are connected to a circuit board module.

Particularly with reference to FIG. 4 and FIG. 6, the first upper wall portion 431 has a claw portion 438 protruding toward the second upper wall portion 432 side. The first upper wall portion 431 has, on an inner wall surface 437A thereof, third projections 441, 442 protruding in the thickness direction. The first upper wall portion 431 has, on the inner wall surface 437A, claw portions 443, 444 protruding in the thickness direction. A second holding surface 445 having a cylindrical-surface shape and extending in the X-axis direction is formed on the second upper wall portion 432 side with respect to the center in the Y-axis direction on the inner wall surface 437A. The second holding surface 445 has a shape that allows a cylindrical battery to be held thereon.

The claw portion 438 has a shape corresponding to the recess 436. The claw portion 438 has a recess 438A at a position corresponding to the screw hole 434. A screw 44 is screwed in a state in which the first upper wall portion 431 is placed such that the claw portion 438 is fitted into the recess 436 and the position where the screw hole 434 is formed and the position where the recess 438A is formed coincide with each other. In this way, the first upper wall portion 431 is held to the side wall portion 41. By detaching the screw 44, the first upper wall portion 431 can be detached. Thus, the first upper wall portion 431 serves as a lid portion.

A first member 446 is provided in the vicinity of one corner on the second upper wall portion 432 side of the inner wall surface 437A of the first upper wall portion 431 having a rectangular shape in a plan view as seen in the Z-axis direction. A second member 447 is provided in the vicinity of another corner on the second upper wall portion 432 side of the inner wall surface 437A of the first upper wall portion 431. A third member 448 is provided in the vicinity of a corner that is located on the first side wall portion 411 side and located, in the X-axis direction, on the side where the second member 447 is provided. That is, the first member 446 and the second member 447 are arranged side by side so as to be separated from each other along the long side of the first upper wall portion 431. The second member 447 and the third member 448 are arranged side by side so as to be separated from each other along the short side of the first upper wall portion 431. The first member 446 and the second member 447 respectively include a first protrusion 446A and a second protrusion 447A protruding in the Z-axis direction, and a first claw portion 446B and a second claw portion 447B extending in the Y-axis direction. The first claw portion 446B and the second claw portion 447B are respectively provided continuously from ends of the first protrusion 446A and the second protrusion 447A on the side opposite to the first upper wall portion 431. The third member 448 includes a third protrusion 448A protruding in the Z-axis direction and a third claw portion 448B extending in the X-axis direction. The third claw portion 448B is provided continuously from an end of the third protrusion 448A on the side opposite to the first upper wall portion 431.

The case 40 has a space $S_1$ as a storage space surrounded by the first side wall portion 411, the second side wall portion 412, the fourth side wall portion 414, the first area 421, the step portion 422B, and the first upper wall portion 431. In addition, the case 40 has a space $S_2$ surrounded by the second side wall portion 412, the third side wall portion 413, the fourth side wall portion 414, the second area 422, and the second upper wall portion 432. When the first upper wall portion 431 is detached, an opening $S_3$ surrounded by the first side wall portion 411, the second side wall portion 412, the fourth side wall portion 414, and the second upper wall portion 432, is formed in a plan view as seen in the Z-axis direction.

With reference to FIG. 2 and FIG. 3, the circuit board module 30 is provided on the second area 422. The circuit board module 30 includes a first board 31 and a connector connection portion 32. The first board 31 has a flat-plate shape. The first board 31 has through holes 311, 312 penetrating in the thickness direction, at positions corresponding to the first projection 426 and the second projection 427. The first projection 426 and the second projection 427 are inserted into the through holes 311, 312, whereby the first board 31 is fixed to the second area 422.

The first board 31 has a first main surface 31A opposed to the second upper wall portion 432, and a second main surface 31B opposite to the first main surface 31A. With reference to FIG. 2 and FIG. 3, the connector connection portion 32 is provided on the second main surface 31B. The connector connection portion 32 is a connection portion to which connectors of the external power supply module 50 and a battery are each connected. The connector connection portion 32 is provided at a position corresponding to the recess 422A of the second area 422. Thus, the connector connection portion 32 is provided at a position spatially connected to the space $S_1$.

The input portions 10 receive inputs from sensors. In the present embodiment, the input portions 10 include three input portions. The input portions 10 are provided on the second main surface 31B of the first board 31, and electrically connected to the circuit board module 30. The input portions 10 are provided so as to be accessible from the external space through the through hole 414A of the fourth side wall portion 414.

The output portion 20 converts signals inputted to the input portions 10 from the sensors, to radio signals, and outputs the radio signals. The output portion 20 is provided on the first main surface 31A of the first board 31, and electrically connected to the circuit board module 30.

Particularly with reference to FIG. 5 to FIG. 8, the external power supply module 50 is a module that converts an input voltage from an external power supply and outputs an output voltage. The external power supply module 50 includes a second board 51, a conversion portion 52, an input terminal 53, and an output terminal 54.

The second board 51 has a flat-plate shape. The second board 51 has a substantially rectangular shape in a plan view as seen in the thickness direction (Z-axis direction). The second board 51 has a first main surface 51A on one side, and a second main surface 51B located on the side opposite to the first main surface 51A in the thickness direction. The second board 51 has through holes 511, 512 penetrating in the thickness direction, at positions corresponding to the third projections 441, 442. With the third projections 441, 442 inserted into the through holes 511, 512, the second board 51 is fixed to the first upper wall portion 431 by the claw portions 443, 444. As a result, the first main surface 51A is opposed to the first area 421. The first main surface 51A is opposed to the first holding surface 421A. The second main surface 51B is opposed to the inner wall surface 437A of the first upper wall portion 431.

The input terminal 53 is a terminal for receiving an input from the external power supply. The conversion portion 52 converts an input voltage inputted to the input terminal 53, to a desired voltage. The output terminal 54 is a terminal for outputting the output voltage converted by the conversion portion 52. The conversion portion 52, the input terminal 53, and the output terminal 54 are provided on the first main surface 51A. The conversion portion 52, the input terminal 53, and the output terminal 54 are arranged along the X-axis direction. As seen from the conversion portion 52, the output terminal 54 is provided on the side opposite to the side where the input terminal 53 is provided. With reference to FIG. 8, the conversion portion 52 is provided so as to be opposed to the first holding surface 421A.

The input terminal 53 has a shape that allows a connector 62 of the external wires 61 to be connected thereto. A connector 58A is provided at one end of internal wires 57, and a connector 58B is provided at another end thereof. The connector 58A has a shape that is connectable to the output terminal 54. The connector 58B has a shape that is connectable to the connector connection portion 32 (see FIG. 2 and FIG. 7). By attaching/detaching the connector 58B of the internal wires 57 to/from the connector connection portion 32, it is possible to attach/detach the external power supply module 50 to/from the circuit board module 30 in a state in which the internal wires 57 are connected to the external power supply module 50.

When the connector 62 of the external wires 61 is connected to the input terminal 53, the external power supply and the external power supply module 50 are electrically connected to each other. When the connector 58A is connected to the output terminal 54 and the connector 58B is connected to the connector connection portion 32, the external power supply module 50 and the circuit board module 30 are electrically connected to each other. It is noted that the external wires 61 pass through the cutout 411C of the first side wall portion 411 so as to be led out to the external space (see particularly FIG. 1).

Figure 9:
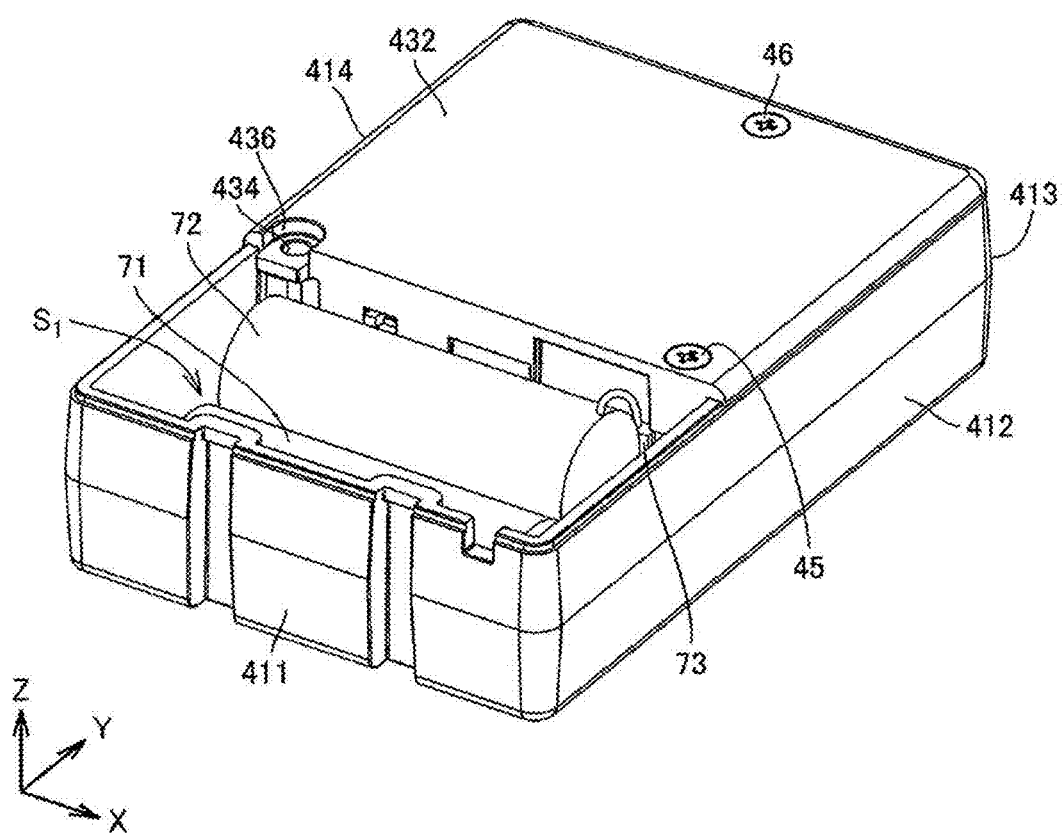
FIG. 9 is a schematic perspective view showing a state in which batteries are mounted.
Figure 10:
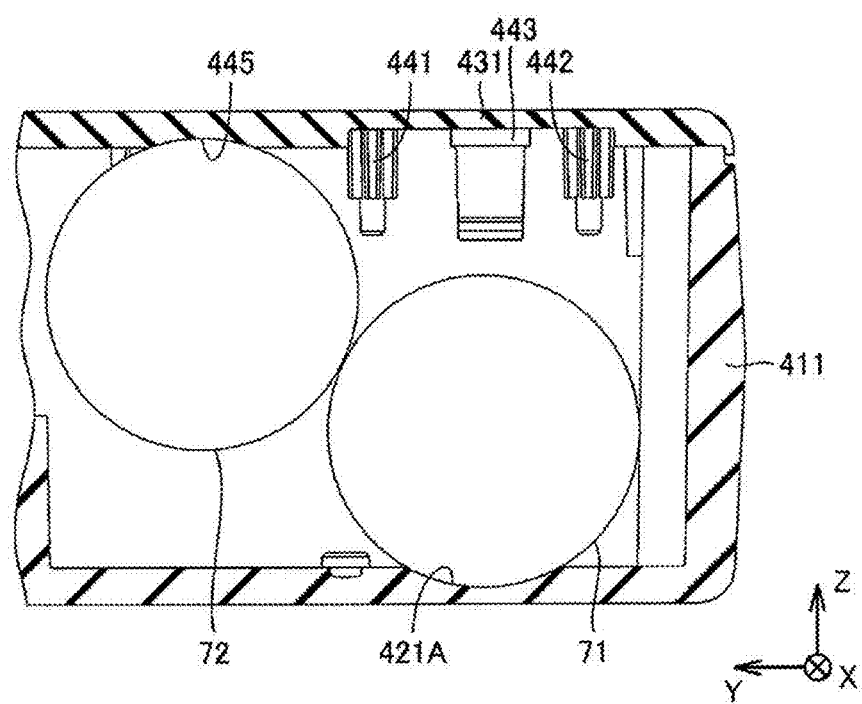
FIG. 10 is a schematic sectional view showing a state in which batteries are stored in a storage space.
Figure 11:
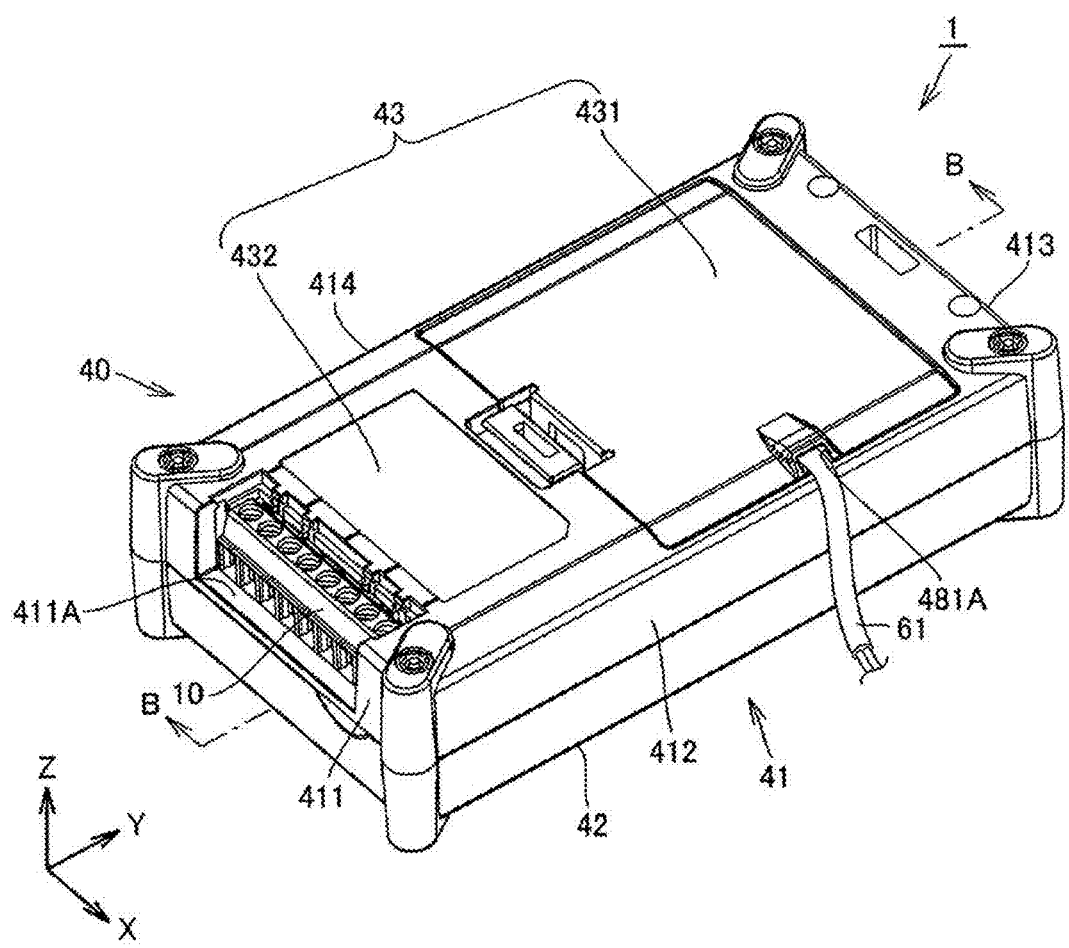
FIG. 11 is a schematic perspective view showing a structure of a wireless terminal device of embodiment 2.

Particularly with reference to FIG. 9 and FIG. 10, when the external power supply module 50 is detached, batteries 71, 72 can be stored in the space $S_1$ as the storage space. In the present embodiment, two cylindrical batteries are stored. When a connector 73 of the batteries 71, 72 is connected to the connector connection portion 32, the batteries 71, 72 and the circuit board module 30 are electrically connected to each other. The battery 71 is held such that an outer circumferential surface of the battery 71 contacts with the first holding surface 421A. The battery 72 is held such that an outer circumferential surface of the battery 72 contacts with the second holding surface 445. That is, the first area 421 of the bottom wall portion 42 and the first upper wall portion 431 serve as a holding portion for holding the batteries 71, 72.

Here, in the wireless terminal device 1 of the present embodiment, when the external power supply module 50 is detached, the batteries 71, 72 can be stored in the space $S_1$. Further, the circuit board module 30 includes the connector connection portion 32 provided at a position spatially connected to the space $S_1$. With such a structure, the connector 58B of the external power supply module 50 and the connector 73 of the batteries 71, 72 can be easily replaced with each other. Therefore, the wireless terminal device 1 can be driven using an external power supply and also the wireless terminal device 1 can be driven with the batteries 71, 72 by mounting the batteries 71, 72.

In the above embodiment, the case 40 has the first holding surface 421A and the second holding surface 445 provided in the space $S_1$ and having cylindrical-surface shapes so as to allow batteries to be held thereon. With such a structure, the batteries 71, 72 can be appropriately held in the space $S_1$ and the batteries 71, 72 can be restricted from moving.

In the above embodiment, when the first upper wall portion 431 is detached from the case 40, the opening $S_3$ is formed. The external power supply module 50 and the batteries 71, 72 each placed in the space $S_1$ can be taken out through the opening $S_3$.

Particularly with reference to FIG. 6, the external wires 61 are wound over more than a half round in the circumferential direction around the first protrusion 446A. Such a structure reduces force of pulling the external wires 61 between the external power supply module 50 and the first protrusion 446A, when the external wires 61 are pulled. Therefore, even when the external wires 61 are pulled, damage around a connection portion with the connector 62 of the external wires 61 can be prevented.

Particularly with reference to FIG. 6, the external wires 61 extending from the external power supply module 50 are wound in contact with the outer circumferential surface of the first protrusion 446A. The external wires 61 extending from the first protrusion 446A are wound in contact with the outer circumferential surface of the second protrusion 447A. The external wires 61 extending from the second protrusion 447A are held by the third member 448 and extend to the external space. In a plan view as seen in a direction (Z-axis direction) perpendicular to a plane (X-Y plane) including a first line along a first direction $L_1$ in which the external wires 61 extend from the external power supply module 50 to the first protrusion 446A and a second line along a second direction $L_2$ in which the external wires 61 extend from the first protrusion 446A to the second protrusion 447A, an angle between the first direction $L_1$ and the second direction $L_2$ is not greater than 90 degrees. In a plan view as seen in a direction (Z-axis direction) perpendicular to a plane (X-Y plane) including a third line along a third direction $L_3$ in which the external wires 61 extend to the third protrusion 448A, and the second line, an angle between the second direction $L_2$ and the third direction $L_3$ is not greater than 90 degrees. Such a structure reduces force of pulling the external wires 61 between the first protrusion 446A and the second protrusion 447A, when the external wires 61 are pulled. Moreover, force of pulling the external wires 61 between the external power supply module 50 and the first protrusion 446A is further reduced. Therefore, even when the external wires 61 are pulled, damage around the connection portion with the connector 62 of the external wires 61 can be further prevented.

Embodiment 2

Next, a wireless terminal device 1 of embodiment 2 of the present disclosure will be described. The wireless terminal device 1 of embodiment 2 basically has the same structure as the wireless terminal device 1 of embodiment 1 and provides the same effects. However, in embodiment 2, a structure of a holding portion for holding a battery is different from that in embodiment 1. Hereinafter, differences from embodiment 1 will be mainly described.

Figure 12:
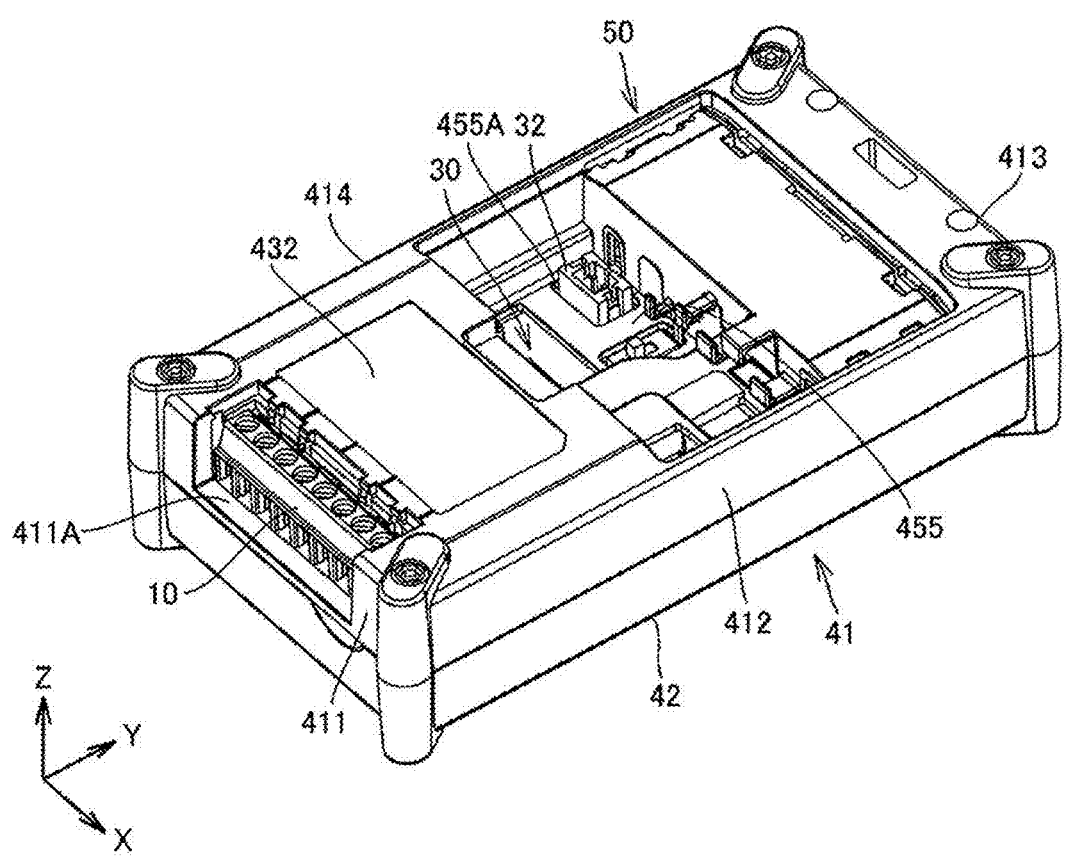
FIG. 12 is a schematic perspective view showing the structure of the wireless terminal device in a state in which a first upper wall portion is detached.
Figure 13:
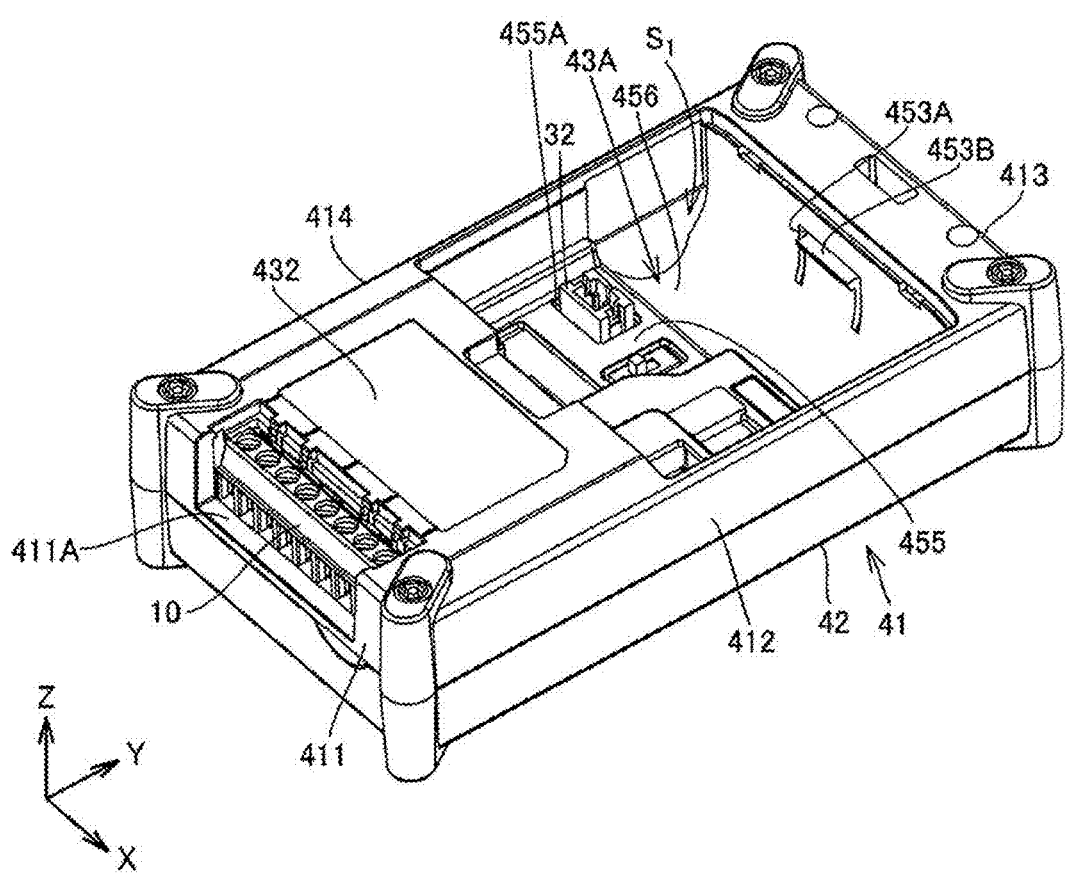
FIG. 13 is a schematic perspective view showing the structure of the wireless terminal device in a state in which the first upper wall portion and an external power supply module are detached.
Figure 14:
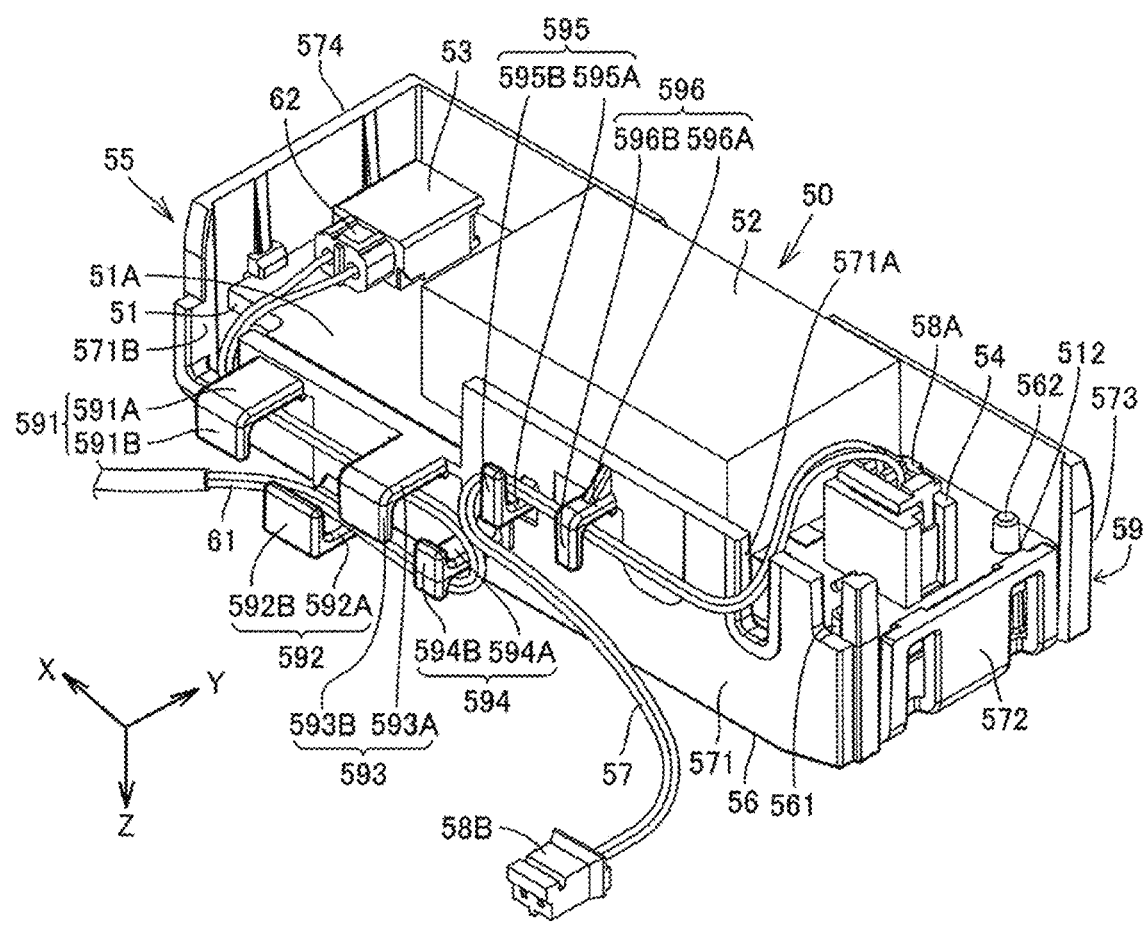
FIG. 14 is a schematic perspective view showing a structure of the external power supply module in embodiment 2.
Figure 15:
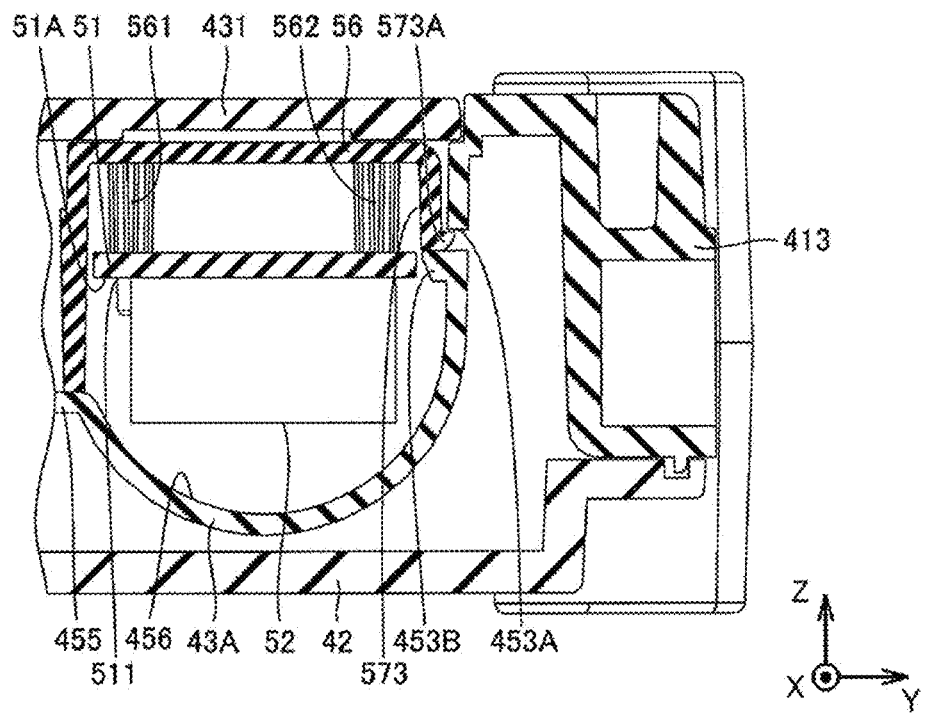
FIG. 15 is a schematic sectional view showing a state in which the external power supply module is mounted.

With reference to FIG. 11 to FIG. 15, embodiment 2 will be described. FIG. 12 is a perspective view corresponding to a state in which the first upper wall portion 431 as the lid portion is detached in FIG. 11. FIG. 13 is a perspective view corresponding to a state in which the first upper wall portion 431 as the lid portion and the external power supply module 50 are detached in FIG. 11. FIG. 15 is a sectional view taken along line B-B in FIG. 11.

The case 40 includes the side wall portion 41, the bottom wall portion 42, the upper wall portion 43, and a holding portion 43A. The upper wall portion 43 includes the first upper wall portion 431 and the second upper wall portion 432. The first upper wall portion 431 has a cutout 481A in an end part on the second side wall portion 412 side at the center in the Y-axis direction. The cutout 481A forms a through hole when the first upper wall portion 431 is attached to the case 40. The cutout 481A has a shape that allows the external wire 61 to pass therethrough.

The holding portion 43A is provided so as to correspond to the first upper wall portion 431 in a plan view as seen in the Z-axis direction. The holding portion 43A is provided in the storage space $S_1$ surrounded by the bottom wall portion 42, the second side wall portion 412, the third side wall portion 413, the fourth side wall portion 414, and the first upper wall portion 431. The holding portion 43A is connected to the second upper wall portion 432 via a connection portion 455. The holding portion 43A has a third holding surface 456 recessed in a cylindrical-surface shape. The third holding surface 456 has a shape that allows a cylindrical battery 74 (see particularly FIG. 16) to be held thereon. At the holding portion 43A, a claw portion 453B protruding in the Y-axis direction is formed. In the holding portion 43A, a through hole 453A extending in the X-axis direction along the claw portion 453B is formed.

The input portion 10 of the circuit board module 30 is provided so as to be exposed from a recess 411A that leads to the second upper wall portion 432 from the center in the Z axis direction of the first side wall portion 411. The connector connection portion 32 of the circuit board module 30 is provided so as to be exposed from a through hole 455A formed in the connection portion 455.

The external power supply module 50 includes the second board 51, the conversion portion 52, the input terminal 53, the output terminal 54, and a holding member 59. The holding member 59 is a member for holding the second board 51. The holding member 59 includes a side wall portion 55 and a bottom lid portion 56. The side wall portion 55 includes a first part 571, a second part 572, a third part 573, and a fourth part 574. The first to fourth parts 571 to 574 have plate shapes. The first part 571 and the third part 573 are arranged in parallel so as to be separated from each other in the Y-axis direction. The second part 572 and the fourth part 574 are arranged in parallel so as to be separated from each other in the X-axis direction. The first part 571 is connected to one end in the Y-axis direction of the second part 572. The third part 573 is connected to another end in the Y-axis direction of the second part 572. The third part 573 is connected to one end in the Y-axis direction of the fourth part 574. In a plan view as seen in the Z-axis direction, the second part 572 is provided so as to have right angles with respect to the first part 571 and the third part 573. In a plan view as seen in the Z-axis direction, the fourth part 574 is provided so as to have a right angle with respect to the third part 573.

In an end part of the first part 571 on the side opposite to the bottom lid portion 56, a first cutout portion 571A penetrating in the thickness direction is formed on the second part 572 side with respect to the center in the X-axis direction. The first cutout portion 571A has a shape that allows the internal wires 57 to pass therethrough. In the end part of the first part 571 on the side opposite to the bottom lid portion 56, a second cutout portion 571B penetrating in the thickness direction is formed on the fourth part 574 side with respect to the center in the X-axis direction. The second cutout portion 571B has a shape that allows the external wires 61 to pass therethrough.

The first part 571 has, on an outer wall surface thereof, a first member 591, a second member 592, a third member 593, a fourth member 594, a fifth member 595, and a sixth member 596. The second member 592 and the fourth member 594 are arranged along the X-axis direction. The first member 591, the third member 593, and the fifth member 595 are arranged along the X-axis direction. The sixth member 596 is provided on the side opposite to the bottom lid portion 56 in the Z-axis direction, as seen from the second member 592 and the fourth member 594.

The first member 591, the second member 592, the third member 593, the fourth member 594, the fifth member 595, and the sixth member 596 respectively include a first protrusion 591A, a second protrusion 592A, a third protrusion 593A, a fourth protrusion 594A, a fifth protrusion 595A, and a sixth protrusion 596A protruding in the Y-axis direction, and a first claw portion 591B, a second claw portion 592B, a third claw portion 593B, a fourth claw portion 594B, a fifth claw portion 595B, and a sixth claw portion 596B extending in the Z-axis direction. The first claw portion 591B, the second claw portion 592B, the third claw portion 593B, the fourth claw portion 594B, the fifth claw portion 595B, and the sixth claw portion 596B are respectively provided continuously from ends, of the first protrusion 591A, the second protrusion 592A, the third protrusion 593A, the fourth protrusion 594A, the fifth protrusion 595A, and the sixth protrusion 596A, on the side opposite to the first part 571.

The external wires 61 are held by the first member 591, the second member 592, and the third member 593, and wound around the fourth member 594. It is noted that the external wires 61 are wound over more than a half round in the circumferential direction around the fourth protrusion 594A of the fourth member 594. The external wires 61 pass through the cutout 481A of the first upper wall portion 431 so as to be led out to the external space (see particularly FIG. 11). The internal wires 57 are held by the sixth member 596 and wound around the fifth protrusion 595A of the fifth member 595.

Columnar portions 561, 562 formed on the bottom lid portion 56 are inserted into the through holes 511, 512 of the second board 51, and the second board 51 is placed in the space surrounded by the side wall portion 55. The second board 51 is held by the first part 571, the second part 572, the third part 573, and the fourth part 574. The conversion portion 52, the input terminal 53, and the output terminal 54 are provided on the first main surface 51A of the second board 51.

Particularly with reference to FIG. 12 and FIG. 15, the external power supply module 50 is placed so as to be opposed to the third holding surface 456 of the holding portion 43A. The external power supply module 50 is placed such that a fourth projection 573A of the holding member 59 is inserted into the through hole 453A of the holding portion 43A. As a result, the first main surface 51A of the second board 51 is opposed to the third holding surface 456. Such a structure can prevent the conversion portion 52 from being damaged by a worker touching the conversion portion 52. The conversion portion 52 is stored effectively using a space on the inner side of the third holding surface 456 having a cylindrical-surface shape.

Figure 16:
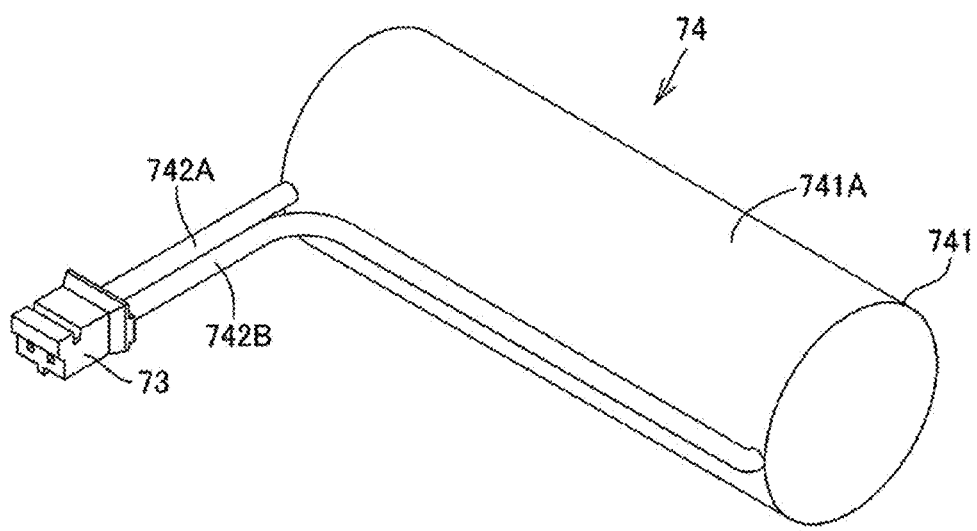
FIG. 16 is a schematic perspective view showing a structure of a battery to be mounted to the wireless terminal device of embodiment 2.

Particularly with reference to FIG. 12, FIG. 13, and FIG. 16, when the external power supply module 50 is detached, the battery 74 can be stored in the space $S_1$ as the storage space. The battery 74 includes a body portion 741 having a cylindrical shape, wires 742A, 742B, and a connector 73. The wires 742A, 742B are electrically connected to electrodes of the body portion 741. The connector 73 is connected to ends of the wires 742A, 742B on the side opposite to the body portion 741. When the connector 73 of the battery 74 is connected to the connector connection portion 32, the battery 74 and the circuit board module 30 are electrically connected to each other. The battery 74 is held such that an outer circumferential surface 741A of the body portion 741 contacts with the third holding surface 456. That is, the holding portion 43A serves as a holding portion for holding the battery 74.

Also in the wireless terminal device 1 of the above embodiment 2, the circuit board module 30 includes the connector connection portion 32 provided at a position spatially connected to the space $S_1$. With such a structure, the connector 58B of the external power supply module 50 and the connector 73 (see particularly FIG. 16) of the battery 74 can be easily replaced with each other. Therefore, as in embodiment 1, the wireless terminal device 1 of the above embodiment 2 can be driven using an external power supply and also can be driven by a battery.

It should be noted that the embodiments disclosed herein are merely illustrative in all aspects and should not be recognized as being restrictive in any aspect. The scope of the present invention is defined not by the above description but by the scope of the claims and is intended to include meaning equivalent to the scope of the claims and all modifications within the scope.

REFERENCE SIGNS LIST 1 wireless terminal device
10 input portion
20 output portion
30 circuit board module
31 first board
31A, 51A first main surface
31B, 51B second main surface
32 connector connection portion
40 case
41 side wall portion
42 bottom wall portion
43 upper wall portion
43A holding portion
44, 45, 46 screw
50 external power supply module
51 second board
52 conversion portion
53 input terminal
54 output terminal
55 side wall portion
56 bottom lid portion
57 internal wire
58A, 58B, 62, 73 connector
59 holding member
61 external wire
71, 72, 74 battery
311, 312, 414A, 453A, 455A, 511, 512 through hole
411 first side wall portion
411A, 422A, 436, 438A recess
411C cutout
412 second side wall portion
413 third side wall portion
414 fourth side wall portion
421 first area
421A first holding surface
422 second area
422B step portion
423 first column
423A, 424A, 425A, 433, 434, 435 screw hole
424 second column
425 third column
426 first projection
427 second projection
431 first upper wall portion
432 second upper wall portion
432B outer wall surface
437A inner wall surface
438, 443, 444, 453B claw portion
441, 442 third projection
445 second holding surface
446, 591 first member
446A, 591A first protrusion
446B, 591B first claw portion
447, 592 second member
447A, 592A second protrusion
447B, 592B second claw portion
448, 593 third member
448A, 593A third protrusion
448B, 593B third claw portion
455 connection portion
456 third holding surface
481A cutout 561, 562 columnar portion
571 first part
571A first cutout portion
571B second cutout portion
572 second part
573 third part
573A fourth projection
574 fourth part
594 fourth member
594A fourth protrusion
594B fourth claw portion
595 fifth member
595A fifth protrusion
595B fifth claw portion
596 sixth member
596A sixth protrusion
596B sixth claw portion
741 body portion
741A outer circumferential surface
742A, 742B wire
$S_1$, $S_2$ space
$S_3$ opening

The invention claimed is:

1. A wireless terminal device comprising:
an input portion configured to receive an input from a sensor;
an output portion configured to convert a signal inputted to the input portion from the sensor, to a radio signal, and output the radio signal;
a circuit board module electrically connected to the input portion and the output portion;
an external power supply module detachably connected to the circuit board module, and including an input terminal for receiving an input from an external power supply, the external power supply module being configured to convert an input voltage inputted to the input terminal and output an output voltage; and
a case in which a storage space for storing the external power supply module is formed, the case being configured to store the input portion, the output portion, the circuit board module, and the external power supply module, wherein
the storage space allows a battery to be stored therein when the external power supply module is detached from the circuit board module, and
the circuit board module includes a connector connection portion that allows one of a connector of the external power supply module and a connector of the battery to be selectively connected thereto, the connector connection portion being provided at a position spatially connected to the storage space.

2. The wireless terminal device according to claim 1, wherein
the case includes a holding portion provided in the storage space and having a holding surface having a cylindrical-surface shape so as to allow the battery to be held thereon.

3. The wireless terminal device according to claim 1, wherein
the case has an opening connecting the storage space and an external space and having a shape that allows the external power supply module and the battery each placed in the storage space to be taken out therethrough,
the case includes a lid portion provided so as to allow the opening to be closed and opened,
the external power supply module includes
a board having a first main surface and a second main surface located on a side opposite to the first main surface in a thickness direction, and
a conversion portion provided on the first main surface, and configured to convert the input voltage inputted to the input terminal from the external power supply and output the output voltage, and
the external power supply module is stored in the storage space such that the second main surface is opposed to the lid portion.

4. The wireless terminal device according to claim 1, wherein
the case has an opening connecting the storage space and an external space and having a shape that allows the external power supply module and the battery each placed in the storage space to be taken out therethrough,
the case includes
a lid portion provided so as to allow the opening to be closed and opened, and
a holding portion provided in the storage space and having a holding surface having a cylindrical-surface shape so as to allow the battery to be held thereon,
the external power supply module includes
a board having a first main surface and a second main surface located on a side opposite to the first main surface in a thickness direction, and
a conversion portion provided on the first main surface, and configured to convert the input voltage inputted to the input terminal from the external power supply and output the output voltage, and
the first main surface of the board is opposed to the holding surface.

5. The wireless terminal device according to claim 1, wherein
the case has a through hole having a shape that allows an external wire connecting the input terminal and the external power supply to pass therethrough.

6. The wireless terminal device according to claim 1, comprising a first member provided inside the case and having a first protrusion protruding in a thickness direction, wherein
an external wire connecting the input terminal and the external power supply is wound in contact with an outer circumferential surface of the first protrusion.

7. The wireless terminal device according to claim 6, wherein
the external wire is wound over more than a half round in a circumferential direction around the first protrusion.

8. The wireless terminal device according to claim 6, further comprising a second member provided inside the case and having a second protrusion protruding in a thickness direction, wherein
the external wire extending from the external power supply module is wound in contact with the outer circumferential surface of the first protrusion,
the external wire extending from the first protrusion is wound in contact with an outer circumferential surface of the second protrusion,
in a plan view as seen in a direction perpendicular to a plane including a first line along a first direction in which the external wire extends from the external power supply module to the first protrusion and a second line along a second direction in which the external wire extends from the first protrusion to the second protrusion, an angle between the first direction and the second direction is not greater than 90 degrees, and in a plan view as seen in a direction perpendicular to a plane including a third line along a third direction in which the external wire extends from the second protrusion to a side different from the first protrusion side, and the second line, an angle between the second direction and the third direction is not greater than 90 degrees.

\* \* \* \* \*